(12) United States Patent
Watakabe et al.

(10) Patent No.: US 12,294,024 B2
(45) Date of Patent: May 6, 2025

(54) METHOD OF MANUFACTURING SEMICONDUCTOR DEVICE

(71) Applicant: Japan Display Inc., Tokyo (JP)

(72) Inventors: Hajime Watakabe, Tokyo (JP); Masashi Tsubuku, Tokyo (JP); Kentaro Miura, Tokyo (JP); Akihiro Hanada, Tokyo (JP); Takaya Tamaru, Tokyo (JP)

(73) Assignee: Japan Display Inc., Tokyo (JP)

( * ) Notice: Subject to any disclaimer, the term of this patent is extended or adjusted under 35 U.S.C. 154(b) by 455 days.

(21) Appl. No.: 17/660,729

(22) Filed: Apr. 26, 2022

(65) Prior Publication Data
US 2022/0367691 A1 Nov. 17, 2022

(30) Foreign Application Priority Data

May 11, 2021 (JP) ................. 2021-080436

(51) Int. Cl.
H01L 29/66 (2006.01)
H01L 21/426 (2006.01)
H01L 21/4757 (2006.01)
H01L 21/4763 (2006.01)
H01L 29/40 (2006.01)
(Continued)

(52) U.S. Cl.
CPC ...... *H01L 29/66969* (2013.01); *H01L 21/426* (2013.01); *H01L 21/47573* (2013.01); *H01L 21/47635* (2013.01); *H01L 29/401* (2013.01); *H01L 29/78621* (2013.01); *H01L 29/42384* (2013.01); *H01L 29/7869* (2013.01)

(58) Field of Classification Search
CPC ............. H01L 29/66969; H01L 21/426; H01L 21/47573; H01L 21/47635; H01L 29/401; H01L 29/78621; H01L 29/42384; H01L 29/7869; H01L 27/1248; H01L 27/1259; H01L 27/127
See application file for complete search history.

(56) References Cited

U.S. PATENT DOCUMENTS

| | | | |
|---|---|---|---|
| 6,846,707 B2* | 1/2005 | Chang | H01L 27/1214 438/150 |
| 7,064,021 B2* | 6/2006 | Chang | H01L 27/127 257/E27.111 |
| 9,741,752 B1* | 8/2017 | Hu | H01L 29/78693 |

(Continued)

FOREIGN PATENT DOCUMENTS

| | | |
|---|---|---|
| JP | 2017-183312 A | 10/2017 |
| JP | 2020-129635 A | 8/2020 |

*Primary Examiner* — Maliheh Malek
(74) *Attorney, Agent, or Firm* — Maier & Maier, PLLC

(57) ABSTRACT

According to one embodiment, a method of manufacturing a semiconductor device, includes forming a first insulating layer, an oxide semiconductor layer, a second insulating layer, a buffer layer and a metal layer sequentially on a base, forming a patterned resist on the metal layer, etching the buffer layer and the metal layer using the resist as a mask to expose an upper surface of the second insulating layer, reducing a volume of the resist to expose an upper surface along a side surface of the metal layer, etching the metal layer using the resist as a mask, to form a gate electrode and to expose an upper surface of the buffer layer, and carrying out ion implantation on the oxide semiconductor layer using the gate electrode as a mask.

4 Claims, 9 Drawing Sheets

(51) Int. Cl.
*H01L 29/423* (2006.01)
*H01L 29/786* (2006.01)

(56) References Cited

U.S. PATENT DOCUMENTS

| | | | | |
|---|---|---|---|---|
| 10,403,757 | B2* | 9/2019 | Zhou | H01L 29/66969 |
| 10,957,721 | B1* | 3/2021 | Li | H01L 27/127 |
| 11,239,331 | B2* | 2/2022 | Ma | H01L 29/78633 |
| 11,637,127 | B2* | 4/2023 | Liu | H01L 27/1262 |
| | | | | 257/59 |
| 2005/0250264 | A1* | 11/2005 | Hotta | H01L 29/78621 |
| | | | | 438/30 |
| 2013/0256652 | A1* | 10/2013 | Lee | H01L 27/1225 |
| | | | | 257/E29.296 |
| 2014/0061632 | A1* | 3/2014 | Lee | H01L 27/1225 |
| | | | | 257/43 |
| 2015/0021592 | A1* | 1/2015 | Seo | H01L 29/7869 |
| | | | | 257/43 |
| 2016/0027886 | A1* | 1/2016 | Yuan | H01L 29/78606 |
| | | | | 257/43 |
| 2016/0293771 | A1* | 10/2016 | Long | H01L 21/283 |
| 2016/0359053 | A1* | 12/2016 | Wang | H01L 29/7869 |
| 2017/0141141 | A1* | 5/2017 | Ge | H01L 27/127 |
| 2017/0278872 | A1* | 9/2017 | Ohara | H01L 27/1214 |
| 2018/0033808 | A1* | 2/2018 | Li | H01L 27/1222 |
| 2018/0122957 | A1* | 5/2018 | Lu | H01L 21/02675 |
| 2018/0149900 | A1* | 5/2018 | Ge | H01L 29/78693 |
| 2019/0074383 | A1* | 3/2019 | Yu | G09G 3/3208 |
| 2019/0172954 | A1* | 6/2019 | Zhou | H01L 21/47635 |
| 2019/0229017 | A1* | 7/2019 | Liu | H01L 27/1248 |
| 2020/0006406 | A1* | 1/2020 | Song | H10K 10/472 |
| 2020/0127141 | A1* | 4/2020 | Zhang | H01L 29/78633 |
| 2020/0259020 | A1* | 8/2020 | Watakabe | H01L 27/1251 |
| 2021/0336018 | A1* | 10/2021 | Ma | H01L 29/78633 |
| 2021/0376164 | A1* | 12/2021 | Wu | H01L 29/78618 |
| 2022/0181493 | A1* | 6/2022 | Miura | H01L 29/78672 |
| 2023/0099934 | A1* | 3/2023 | Gong | H01L 27/1248 |
| 2024/0178240 | A1* | 5/2024 | Ma | H01L 27/1248 |

* cited by examiner

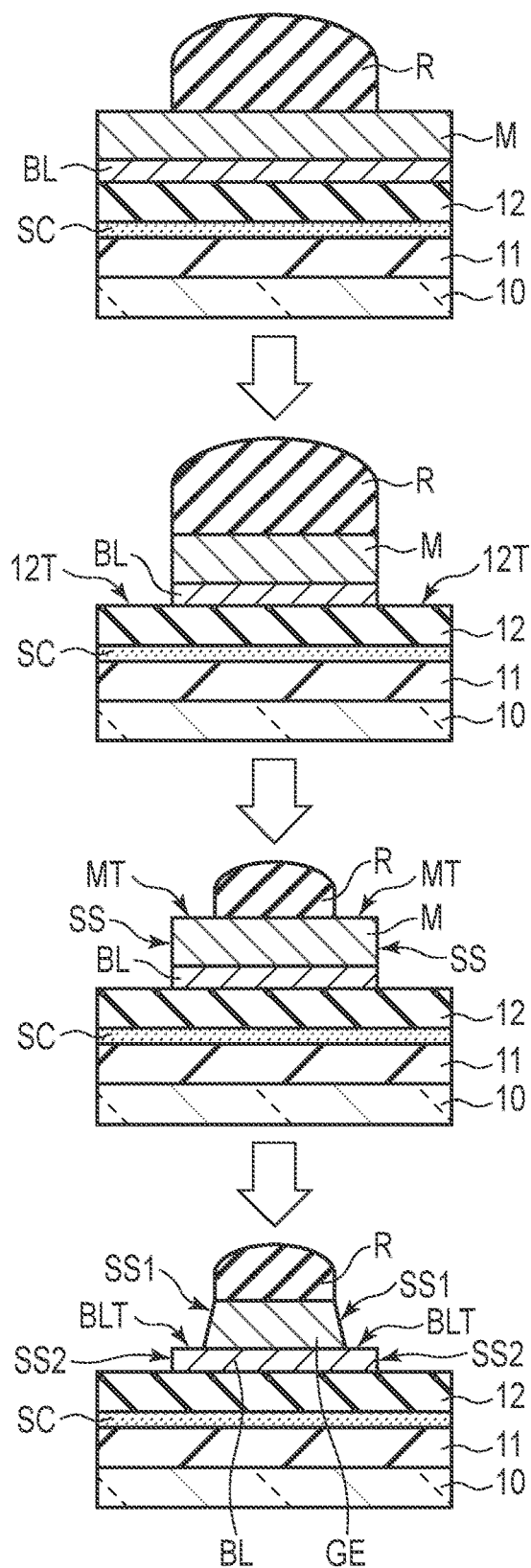
F I G. 2

METHOD OF MANUFACTURING SEMICONDUCTOR DEVICE

CROSS-REFERENCE TO RELATED APPLICATIONS

This application is based upon and claims the benefit of priority from Japanese Patent Application No. 2021-080436 filed May 11, 2021, the entire contents of which are incorporated herein by reference.

FIELD

Embodiments described herein relate generally to a method of manufacturing a semiconductor device.

BACKGROUND

In recent years, various types of semiconductor devices for display devices and the like, which include a transistor using oxide semiconductors have been proposed. In such transistors which use oxide semiconductors, a high voltage is applied between a source and a drain, and therefore degradation may occur, which may further cause degradation in reliability such as a shift in threshold voltage.

Under these circumstances, it is considered to form low-resistance regions between the channel region and the source region, and between the channel region and the drain region, respectively.

BRIEF DESCRIPTION OF THE DRAWINGS

FIG. 2 is a diagram for illustrating a method of manufacturing the semiconductor device 1.

DETAILED DESCRIPTION

Figure 1:
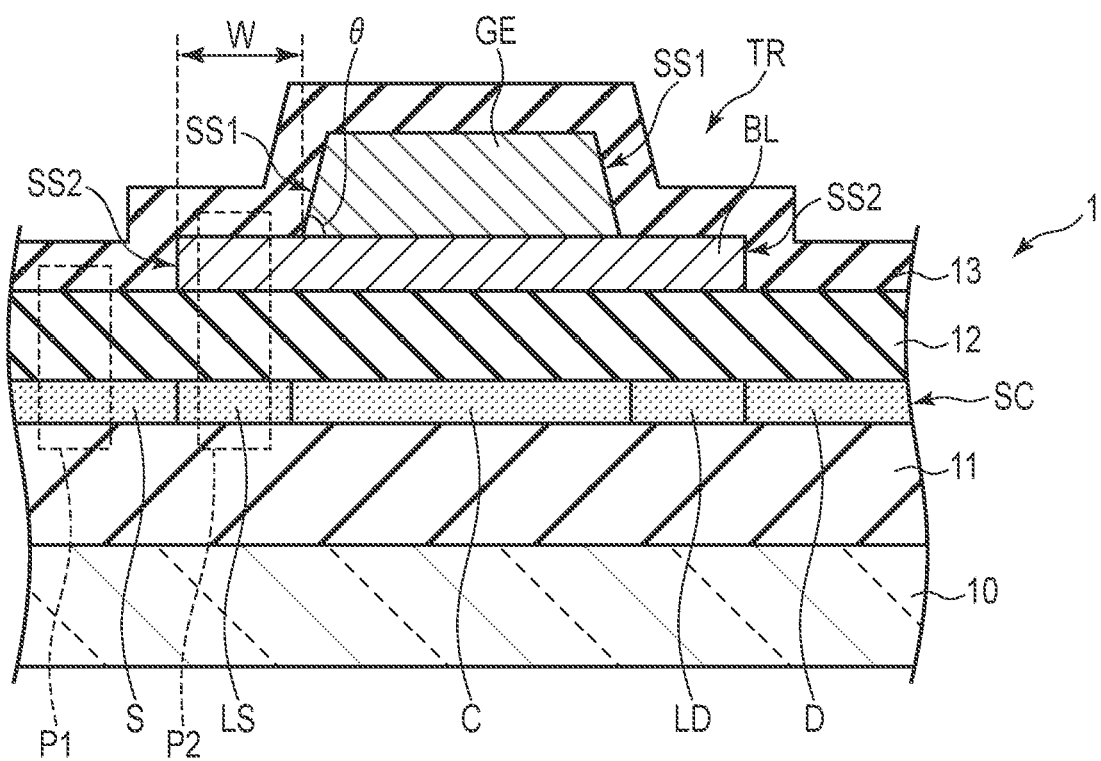
FIG. 1 is a cross sectional view showing an example of a semiconductor device 1 according to an embodiment.

An object of the embodiments is to provide a method of manufacturing a semiconductor device, which can suppress degradation of reliability of the semiconductor device and simplify the semiconductor device manufacturing process.

In general, according to one embodiment, a method of manufacturing a semiconductor device, comprises forming a first insulating layer, an oxide semiconductor layer, a second insulating layer, a buffer layer and a metal layer sequentially on a base, forming a patterned resist on the metal layer, etching the buffer layer and the metal layer using the resist as a mask to expose an upper surface of the second insulating layer, reducing a volume of the resist to expose an upper surface along a side surface of the metal layer, etching the metal layer using the resist as a mask, to form a gate electrode including a first side surface and to expose an upper surface along a second side surface of the buffer layer, and carrying out ion implantation on the oxide semiconductor layer using the gate electrode as a mask.

According to another embodiment, a method of manufacturing a semiconductor device, comprises forming a first insulating layer, an oxide semiconductor layer, a second insulating layer, a buffer layer and a metal layer sequentially on a base, forming a patterned resist on the metal layer, etching the second insulating layer, the buffer layer and the metal layer using the resist as a mask to expose an upper surface of the oxide semiconductor layer, reducing a volume of the resist to expose an upper surface along a side surface of the metal layer, etching the metal layer using the resist as a mask, to form a gate electrode including a first side surface and to expose an upper surface along a second side surface of the buffer layer, and carrying out a reduction treatment on the oxide semiconductor layer.

According to still another embodiment, a method of manufacturing a semiconductor device, comprises forming a first insulating layer, an oxide semiconductor layer, a second insulating layer, a buffer layer and a metal layer sequentially on a base, forming a patterned first resist on the metal layer, etching the metal layer using the first resist as a mask to form the gate electrode and to expose an upper surface of the buffer layer, removing the first resist, and then forming a second resist which covers the gate electrode and portions of the buffer layer on respective sides of the gate electrode, etching the buffer layer using the second resist as a mask to expose an upper surface of the second insulating layer and removing the second resist, and carrying out ion implantation on the oxide semiconductor layer using the gate electrode as a mask.

According to still another embodiment, a method for manufacturing a semiconductor device, comprises forming a first insulating layer, an oxide semiconductor layer, a second insulating layer, a buffer layer and a metal layer sequentially on a base, forming a patterned first resist on the metal layer, etching the metal layer using the first resist as a mask to form the gate electrode and to expose an upper surface of the buffer layer, removing the first resist, and then forming a second resist which covers the gate electrode and portions of the buffer layer on respective sides of the gate electrode, etching the second insulating layer and the buffer layer using the second resist as a mask to expose an upper surface of the oxide semiconductor layer and removing the second resist and carrying out a reduction treatment on the oxide semiconductor layer.

According to such configurations, it is possible to provide a method of manufacturing a semiconductor device, which can suppress degradation of reliability of the semiconductor device and simplify the semiconductor device manufacturing process.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that in order to make the descriptions easily understandable as needed, the drawings indicate an X-axis, a Y-axis and a Z-axis, which are orthogonal to each other. A direction along the X-axis is referred to as a X direction or a first direction, a direction along the Y-axis is referred to as a Y direction or a second direction, a direction along the Z axis is referred to as a Z direction or a third direction. A plane defined by the X-axis and Y-axis is referred to as an X-Y plane. Viewing towards the X-Y plane is referred to as plan view.

A semiconductor device 1 according to the present embodiment is applicable to various types of display devices such as a liquid crystal display device, an organic electroluminescent display device, an electrophoretic display device, and LED display device, various types of sensors such as a capacitive sensor and an optical sensor, and other electronic devices.

<<Configuration 1>>

FIG. 1 is a cross-sectional view showing an example of a semiconductor device 1 according to this embodiment.

The semiconductor device 1 comprises a base 10, a first insulating layer 11, a second insulating layer 12, a third insulating layer 13, a buffer layer BL and a transistor TR. FIG. 1 shows one transistor TR contained in the semiconductor device 1. The transistor TR comprises an oxide semiconductor layer SC and a gate electrode GE.

The first insulating layer 11 is disposed on the base 10. The oxide semiconductor layer SC is disposed on the first insulating layer 11. The second insulating layer 12 is disposed on the oxide semiconductor layer SC. The buffer layer BL is disposed on the second insulating layer 12. The gate electrode GE is disposed on the buffer layer BL. The third insulating layer 13 is disposed on the second insulating layer 12 and covers the gate electrode GE and the buffer layer BL.

The base 10 is a substrate formed of an insulating material such as glass, resin film or the like.

The first insulating layer 11 and the second insulating layer 12 may be of a single layer or a multilayer. For example, the first insulating layer 11 and the second insulating layer 12 are silicon oxide layers. When the first insulating layer 11 and the second insulating layer 12 are multilayers, the first insulating layer 11 and the second insulating layer 12 each include a silicon oxide layer brought into contact with the oxide semiconductor layer SC.

The buffer layer BL is a layer having, for example, the function of mitigating ion implantation into the oxide semiconductor layer SC (an ion implantation blocking ability) or the function of mitigating hydrogen diffusion into the oxide semiconductor layer SC (a hydrogen diffusion blocking ability). The buffer layer BL with such a configuration is any one of, for example, a silicon oxide layer, a silicon nitride layer, an oxide semiconductor layer such as IGZO and a metal layer such as titanium.

The gate electrode GE is formed, for example, of a metal material such as aluminum (Al), titanium (Ti), molybdenum (Mo), tungsten (W), silver (Ag), copper (Cu), chromium (Cr) or the like or an alloy of a combination of any of these metal materials. First side surfaces SS1 of the gate electrode GE should each preferably be a sloped surface. An angle θ made between each first side surface SS1 and an upper surface of the buffer layer BL (or a lower surface of the gate electrode GE), which is brought into contact with the gate electrode GE, is an acute angle.

On respective sides of the gate electrode GE, the first side surfaces SS1 are located on an inner side with respect to second side surfaces SS2 of the buffer layer BL. The widths W of portions of the buffer layer BL, each taken from the respective first side surface SS1 to the respective second side surfaces SS2 on respective sides of the gate electrode GE are substantially equal to each other and should preferably be 0.5 μm or greater.

The third insulating layer 13 is, for example, a silicon nitride layer. The third insulating layer 13 is in contact with the buffer layer BL between each first side surface SS1 and each respective second side surface SS2, and also in contact with the second insulating layer 12 on an outer side of second side surface SS2. Here, since the first side surfaces SS1 of the gate electrode GE are sloped surfaces, cracking of the third insulating layer 13 can be suppressed.

The oxide semiconductor layer SC includes a channel region C, a source region S, a drain region D, a low-resistance region LS and a low-resistance region LD. The channel region C is located directly below the gate electrode GE. The source region S and the drain region D are located directly below regions with which the second insulating layer 12 and the third insulating layer 13 are respectively brought into contact. The low-resistance region LS is located between the channel region C and the source region S. The low-resistance region LD is located between the channel region C and the drain region D.

Further, the low-resistance region LS and the low-resistance region LD are located directly below regions with which the buffer layer BL and the third insulating layer 13 are respectively brought into contact, or directly below a region between the first side surface SS1 and the second side surface SS2. In other words, the buffer layer BL overlaps the channel region C, the low-resistance region LS, and the low-resistance region LD, but does not overlap the source region S and the drain region D.

The low-resistance region LS and the low-resistance region LD have higher impurity concentration and lower resistance as compared to those of the channel region C. The source region S and the drain region D have higher impurity concentration and lower resistance as compared to the low-resistance regions LS and LD. The term "impurity concentration" used in this specification can be expressed as the number of impurities per unit volume. Note that for oxide semiconductors, a high impurity concentration means a high number of oxygen defects per unit volume or a high number of defects per unit volume.

Next, a method of manufacturing the above-described semiconductor device 1 will be described with reference to FIGS. 2 and 3.

First, as shown in FIG. 2, on the base 10, a first insulating layer 11, an oxide semiconductor layer SC, a second insulating layer 12, a buffer layer BL, and a metal layer M are formed sequentially in this order. Here, for example, the first insulating layer 11, the second insulating layer 12, and the buffer layer BL are each formed by depositing silicon oxide. Then, a resist R patterned into a predetermined shape is formed on the metal layer M.

Next, using the resist R as a mask, the buffer layer BL and the metal layer M are etched (dry etching) to expose an upper surface 12T of the second insulating layer 12.

Then, the volume of the resist R is reduced to expose an upper surface MT of the metal layer M, which is along the side surface SS. Here, for example, an ashing process is applicable as a technique to reduce the volume of the resist R. By performing the ashing process on the resist R, the volume of the resist R is isotropically reduced. Therefore, the areas or the widths of the portions of the upper surface MT, which are exposed from the resist R on respective sides thereof are substantially equal to each other. The width of the portions of the upper surface MT, which are exposed from the resist R is equivalent to the width of the low-resistance regions LS and LD, which will be formed later, and it is, for example, 0.5 µm or greater.

Subsequently, the metal layer M is etched (dry etching) using the resist R as a mask. Thus, the gate electrode GE with sloped first side surfaces SS1 is formed and an upper surface BLT of the buffer layer BL, which is along the second side surfaces SS2, is exposed. The areas or the widths of the portions of the upper surface BLT, which are exposed from the resist R and the gate electrode GE on respective sides across the gate electrode GE are substantially equal to each other.

Figure 3:
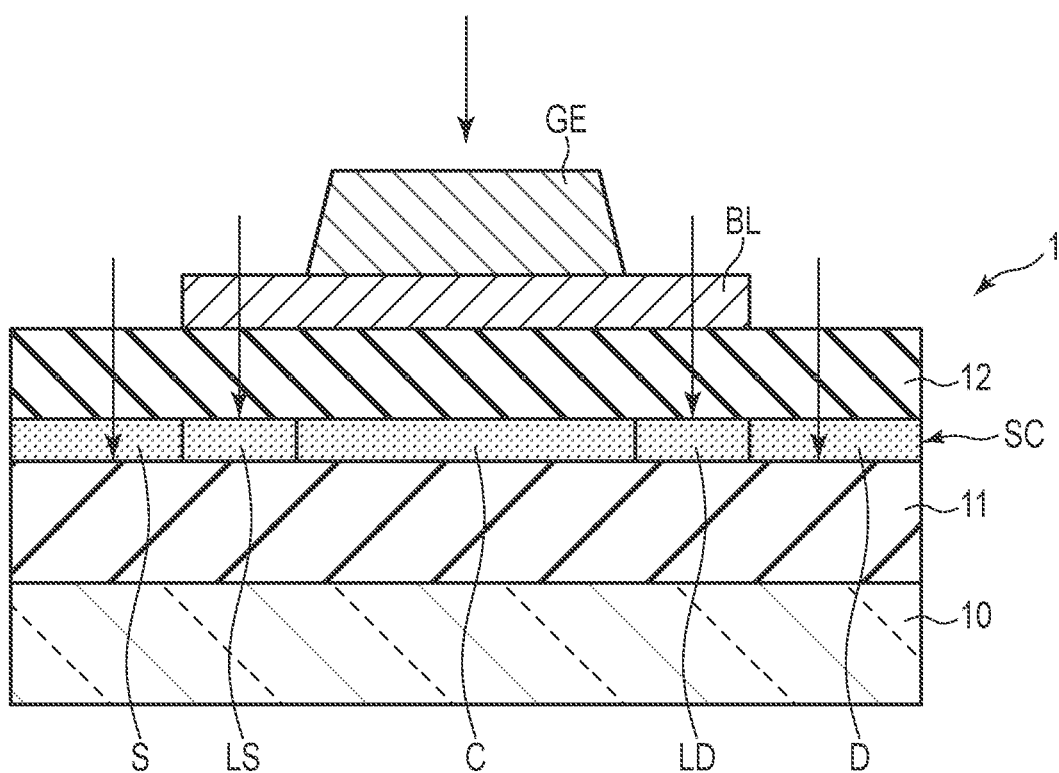
FIG. 3 is a diagram for illustrating a method of manufacturing the semiconductor device 1, which includes an ion implantation step.

Then, as shown in FIG. 3, the oxide semiconductor layer SC is subjected to ion implantation using the gate electrode GE as a mask. Here, for example, boron (B) as an impurity is doped into the oxide semiconductor layer SC by the ion implantation. Note that in place of boron, some other impurity such as phosphorus (P) may be doped into the oxide semiconductor layer SC. The ion implantation into the oxide semiconductor layer SC may be performed without removing the resist R or may be performed after removing the resist R.

As a result, in the oxide semiconductor layer SC, a channel region C with substantially no impurities doped therein, a source region S and a drain region D with impurities doped therein, and a low-resistance region LS between the channel region C and the source region S, and a low resistance region LD between the channel region C and the drain region D are formed. As described above, since the buffer layer BL has the ion implantation blocking capability, the impurity concentrations of the low-resistance region LS and the low-resistance region LD located directly below the buffer layer BL are lower than the impurity concentrations of the source region S and the drain region D, which are not covered by the buffer layer BL.

Thereafter, the third insulating layer 13 is formed thereon, and thus the semiconductor device 1 shown in FIG. 1 is manufactured.

As explained above, the oxide semiconductor layer SC includes the low resistance regions LS and LD, adjacent to the channel region C, and with this configuration, the degradation of the oxide semiconductor layer SC, which may occur when high voltage is applied thereto, can be suppressed. Thus, undesirable shift in threshold voltage can be suppressed and degradation in reliability can be suppressed.

Further, the low-resistance regions LS and LD with such configurations can be formed in a single ion implantation process at the same timing when the source region S and the drain region D are formed. Furthermore, the buffer layer BL and the gate electrode GE, which includes side surfaces at positions different from each other, are formed using the same resist R. In this manner, the manufacturing process of the semiconductor device 1 is simplified.

Figure 4:
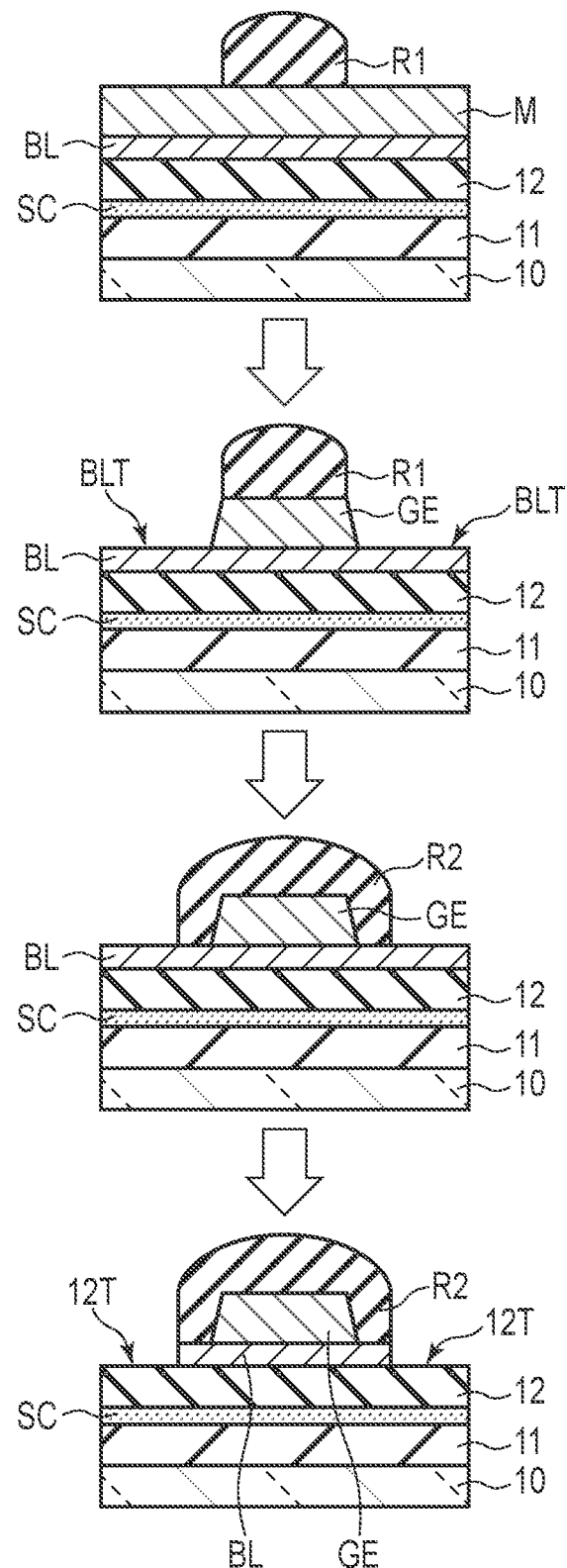
FIG. 4 is a diagram illustrating another method of manufacturing the semiconductor device 1.

Next, another method of manufacturing the semiconductor device 1 will be described with reference to FIG. 4.

First, on the base 10, a first insulating layer 11, an oxide semiconductor layer SC, a second insulating layer 12, a buffer layer BL and a metal layer M are formed sequentially in this order. Thereafter, a first resist R1 patterned into a predetermined shape is formed on the metal layer M.

Then, the metal layer M is etched (dry etched) using the first resist R1 as a mask. Thus, the gate electrode GE is formed and the upper surface BLT of the buffer layer BL is exposed. Thereafter, the first resist R1 is removed.

Subsequently, a second resist R2 is formed to cover the gate electrode GE and portions of the buffer layer BL on respective sides of the gate electrode GE. The widths of the portions of the buffer layer BL covered by the second resist R2 are equivalent to the widths of the low-resistance regions LS and LD, which will be formed later, and it is, for example, 0.5 µm or greater.

Then, the buffer layer BL is etched (dry etched) using the second resist R2 as a mask. Thus, the upper surface 12T of the second insulating layer 12 is exposed. After that, the second resist R2 is removed.

Next, as shown in FIG. 3, the oxide semiconductor layer SC is subjected to ion implantation using the gate electrode GE as a mask.

Then, the third insulating layer 13 is formed, and thus the semiconductor device 1 shown in FIG. 1 is manufactured.

In this another manufacturing method as well, the low-resistance regions LS and LD are formed by a single ion implantation process at the same timing when the source region S and the drain region D are formed. Thus, the manufacturing process of the semiconductor device 1 is simplified.

<<Configuration 2>>

Figure 5:
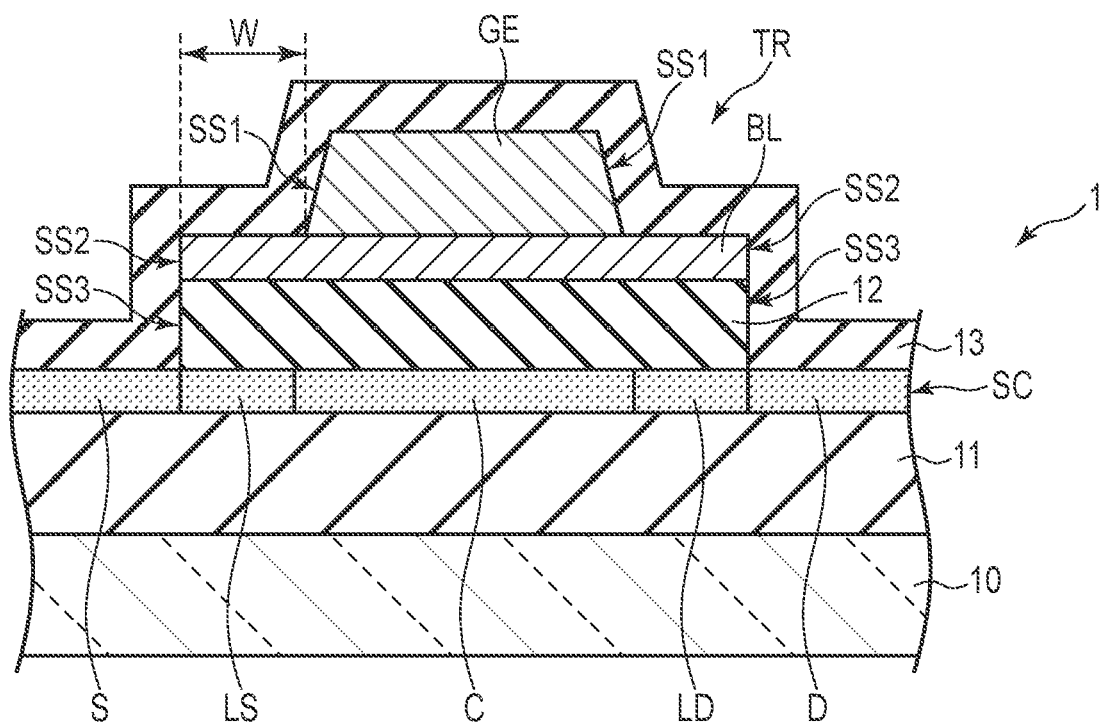
FIG. 5 is a cross sectional view showing another example of the semiconductor device 1 according to the embodiment.

FIG. 5 is a cross-sectional view showing another example of the semiconductor device 1 of this embodiment.

The example shown in FIG. 5 is different from that of FIG. 1 in that the source region S and the drain region D of the oxide semiconductor layer SC are exposed from the second insulating layer 12. Here, the descriptions of the same configurations as those of the example shown in FIG. 1 may be omitted.

On respective sides of the gate electrode GE, the first side surfaces SS1 of the gate electrode GE are located on an inner side with respect to the second side surfaces SS2 of the buffer layer BL and third side surfaces SS3 of the second insulating layer 12. The second side surfaces SS2 are located directly above the third side surfaces SS3, respectively. The widths W from the first side surfaces SS1 to the respective second side surfaces SS2 (or the widths from the first side surfaces SS1 to the respective third side surfaces SS3) on respective sides of the gate electrode GE are substantially equal to each other, and should preferably be 0.5 µm or greater.

The third insulating layer 13 covers the gate electrode GE, the buffer layer BL, the second insulating layer 12 and the oxide semiconductor layer SC. In the example illustrated, the third insulating layer 13 covers the gate electrode GE and is brought into contact with the buffer layer BL between each second side surface SS1 and each respective second side surface SS2, into contact with the second side surfaces SS2 and the third side surfaces SS3, and into contact with the oxide semiconductor layer SC on an outer side of each third side surface SS3.

In the oxide semiconductor layer SC, the channel region C is located directly below the gate electrode GE. The source region S and the drain region D are in contact with the third insulating layer 13. The low-resistance region LS and the low-resistance region LD are located directly below regions with which the buffer layer BL and the third insulating layer 13 are brought into, or directly below regions between the first side surfaces SS1 and the respective second side surfaces SS2, or directly below regions between the first side surfaces SS1 and the respective third side surfaces SS3. In other words, the stacked layers of the second insulating layer 12 and the buffer layer BL overlap the channel region C, the low-resistance region LS and the low-resistance region LD, and do not overlap the source region S and the drain region D.

Next, a method of manufacturing the above-described semiconductor device 1 will be described with reference to FIGS. 6 and 7.

Figure 6:
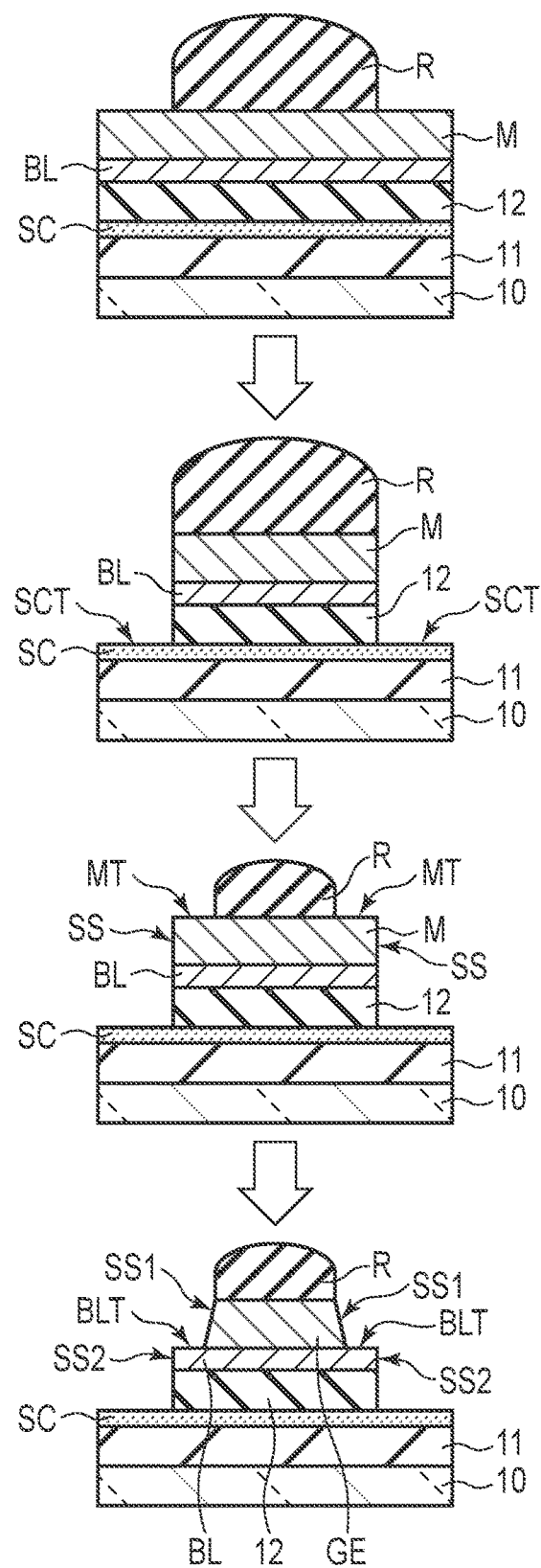
FIG. 6 is a diagram for illustrating a method of manufacturing the semiconductor device 1.

First, as shown in FIG. 6, on the base 10, a first insulating layer 11, an oxide semiconductor layer SC, a second insulating layer 12, a buffer layer BL and a metal layer M are formed sequentially in this order. For example, the first insulating layer 11, the second insulating layer 12, and the buffer layer BL are each formed by depositing silicon oxide. Then, a resist R patterned into a predetermined shape is formed on the metal layer M.

Subsequently, using the resist R as a mask, the second insulating layer 12, the buffer layer BL and the metal layer M are etched (dry etching) to expose an upper surface SCT of the oxide semiconductor layer SC.

Then, the volume of the resist R is reduced to expose the upper surface MT along the side surfaces SS of the metal layer M. Here, for example, an ashing process is applicable as a technique to reduce the volume of the resist R.

After that, using the resist R as a mask, the metal layer M is etched (dry etching). Thus, a gate electrode GE with sloped first side surfaces SS1 is formed, and the upper surface BLT along the second side surfaces SS2 of the buffer layer B is exposed.

Figure 7:
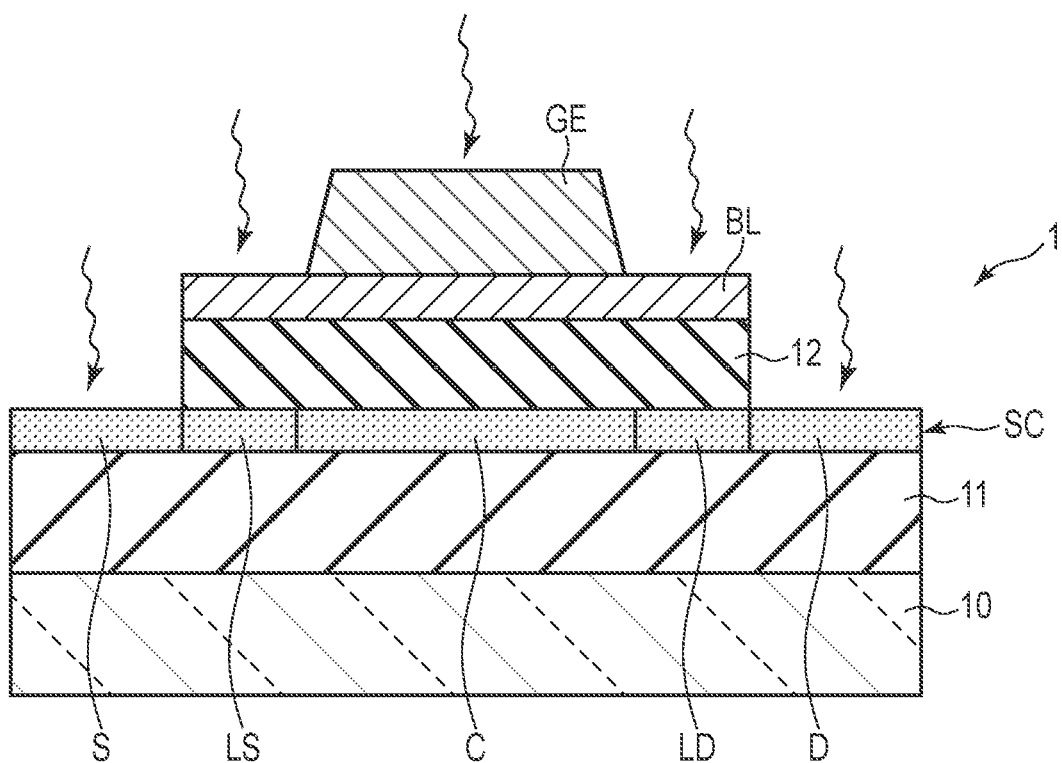
FIG. 7 is a diagram for illustrating a method of manufacturing the semiconductor device 1, which includes a reduction step.

Subsequently, as shown in FIG. 7, the oxide semiconductor layer SC is subjected to a reduction treatment. For example, the reduction treatment is a hydrogen plasma treatment. The hydrogen plasma treatment may be performed without removing the resist R or may be performed after removing the resist R.

As a result, the exposed portions of the oxide semiconductor layer SC are made to have low-resistance by the reduction effect of hydrogen and formed as the source region S and the drain region D. Further, the portions of the oxide semiconductor layer SC, which the stacked layers of the second insulating layer 12 and the buffer layer BL overlap, are made to have low-resistance by the reduction effect of the hydrogen permeating through the stacked layers or the hydrogen diffused from the source region S or the drain region D, to be formed as the low-resistance region LS and the low-resistance region LD. Note, here, that the amount of hydrogen supplied to the low-resistance region LS and the low-resistance region LD is less than that supplied to the source region S and the drain region D. Therefore, the resistances of the low-resistance region LS and the low-resistance region LD are higher than those of the source region S and the drain region D. On the other hand, the portion of the oxide semiconductor layer SC, directly below the gate electrode GE is not substantially subjected to the reduction effect by hydrogen and is formed as the channel region C. Therefore, the resistance of the channel region C is higher than those of the low-resistance region LS and the low-resistance region LD.

Thereafter, the third insulating layer 13 is formed, and thus the semiconductor device 1 shown in FIG. 5 is manufactured.

The above-described example is described in connection with the case where the reduction treatment is a hydrogen plasma process, but the reduction treatment is not particularly limited to this. For example, when forming the third insulating layer 13, silicon nitride is deposited to form the third insulating layer 13. Thus, the portions of the oxide semiconductor layer SC, which are in contact with the third insulating layer 13 are subjected to the reduction effect by hydrogen in the process of forming the third insulating layer 13, thus lowering the resistances thereof, and thus formed as the source region S and the drain region D. Subsequently, annealing is carried out and hydrogen contained in each of the source region S and the drain region D diffuses, and therefore the portion of the oxide semiconductor layer SC, which is adjacent to the source region S is made to have low resistance, and is formed as the low-resistance region LS, and the portion adjacent to the drain region D is made to have low resistance and is formed as the low-resistance region LD.

As described above, the oxide semiconductor layer SC includes the low-resistance regions LS and LD adjacent to the channel region C, and therefore, advantageous effects similar to those of the Configuration 1 described above can be obtained.

Further, the low-resistance regions LS and LD having such configurations are formed by the reduction treatment of the oxide semiconductor layer SC, are formed substantially as the same timing when the source region S and drain region D are formed. Furthermore, the buffer layer BL and gate electrode GE, which include side surfaces located at positions different from each other, are formed using the same resist R. Therefore, the manufacturing process of the semiconductor device 1 can be simplified.

Figure 8:
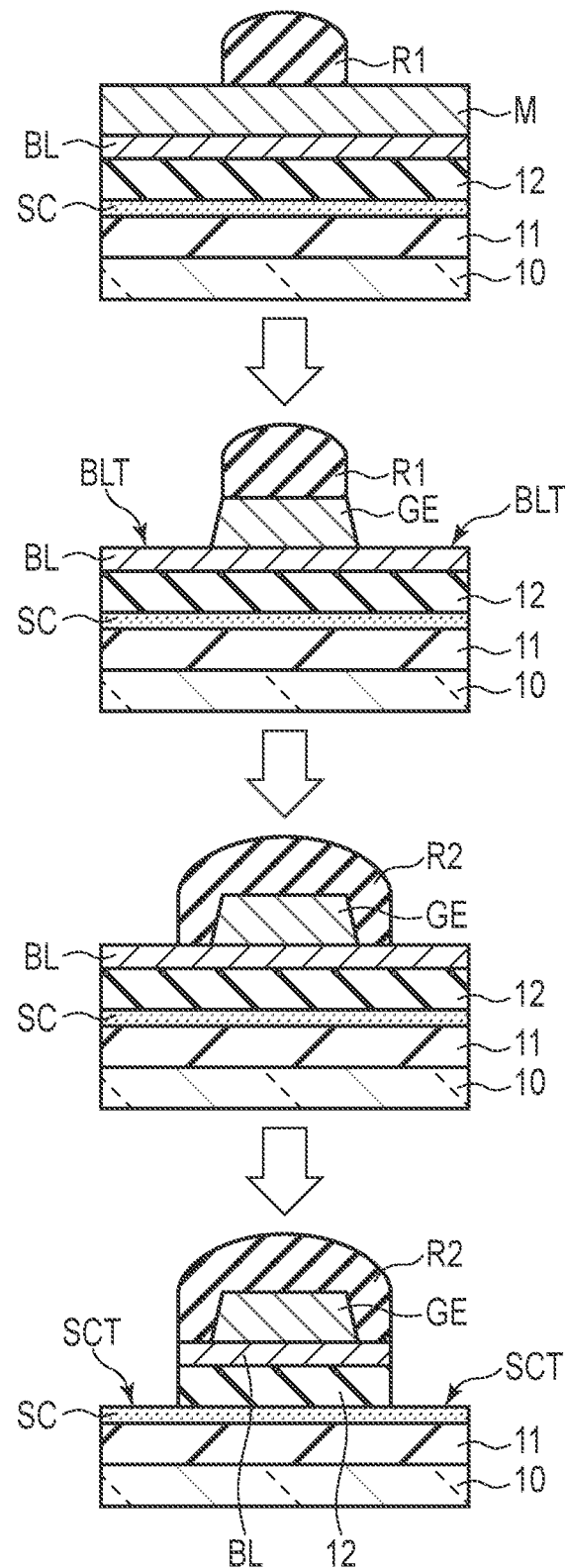
FIG. 8 is a diagram for illustrating another method of manufacturing the semiconductor device 1.

Next, another method of manufacturing the semiconductor device 1 will be described with reference to FIG. 8.

First, on the base 10, a first insulating layer 11, an oxide semiconductor layer SC, a second insulating layer 12, a buffer layer BL and a metal layer M are formed sequentially in the order. Thereafter, a first resist R1 patterned into a predetermined shape is formed on the metal layer M.

Then, the metal layer M is etched (dry etching) using the first resist R1 as a mask. Thus, the gate electrode GE is formed, and an upper surface BLT of the buffer layer BL is exposed. After that, the first resist R1 is removed.

Subsequently, a second resist R2 is formed to cover the gate electrode GE and portions of the buffer layer BL on respective sides of the gate electrode GE.

After that, using the second resist R2 as a mask, the second insulating layer 12 and the buffer layer BL are etched (dry etching). Thus, an upper surface SCT of the oxide semiconductor layer SC is exposed. Then, the second resist R2 is removed.

Next, the oxide semiconductor layer SC is subjected to reduction treatment.

Thereafter, the third insulating layer 13 is formed, and thus the semiconductor device 1 shown in FIG. 5 is manufactured. In this example, the reduction treatment of the oxide semiconductor layer SC may be the plasma treatment described above, or a combination of deposition of a silicon nitride layer and hydrogen diffusion treatment.

In this another manufacturing method as well, the low-resistance regions LS and LD are formed by the reduction treatment of the oxide semiconductor layer SC substantially at the same time when the source region S and the drain region D are formed. Therefore, the manufacturing process of the semiconductor device 1 is simplified.

Next, assuming portions P1 and P2 enclosed by dotted lines in the cross-sectional view shown in FIG. 1, the impurity concentrations of the portions P1 and P2 were calculated by simulation. In this simulation, the concentration of boron was calculated as the impurity concentration.

The portion P1 is a region where the first insulating layer 11, the oxide semiconductor layer SC, and the second insulating layer 12 are stacked, and the buffer layer BL does not exist. In other words, the thickness of the buffer layer BL is 0 nm.

The portion P2 is a region where the first insulating layer 11, the oxide semiconductor layer SC, the second insulating layer 12 and the buffer layer BL are stacked.

Figure 9:
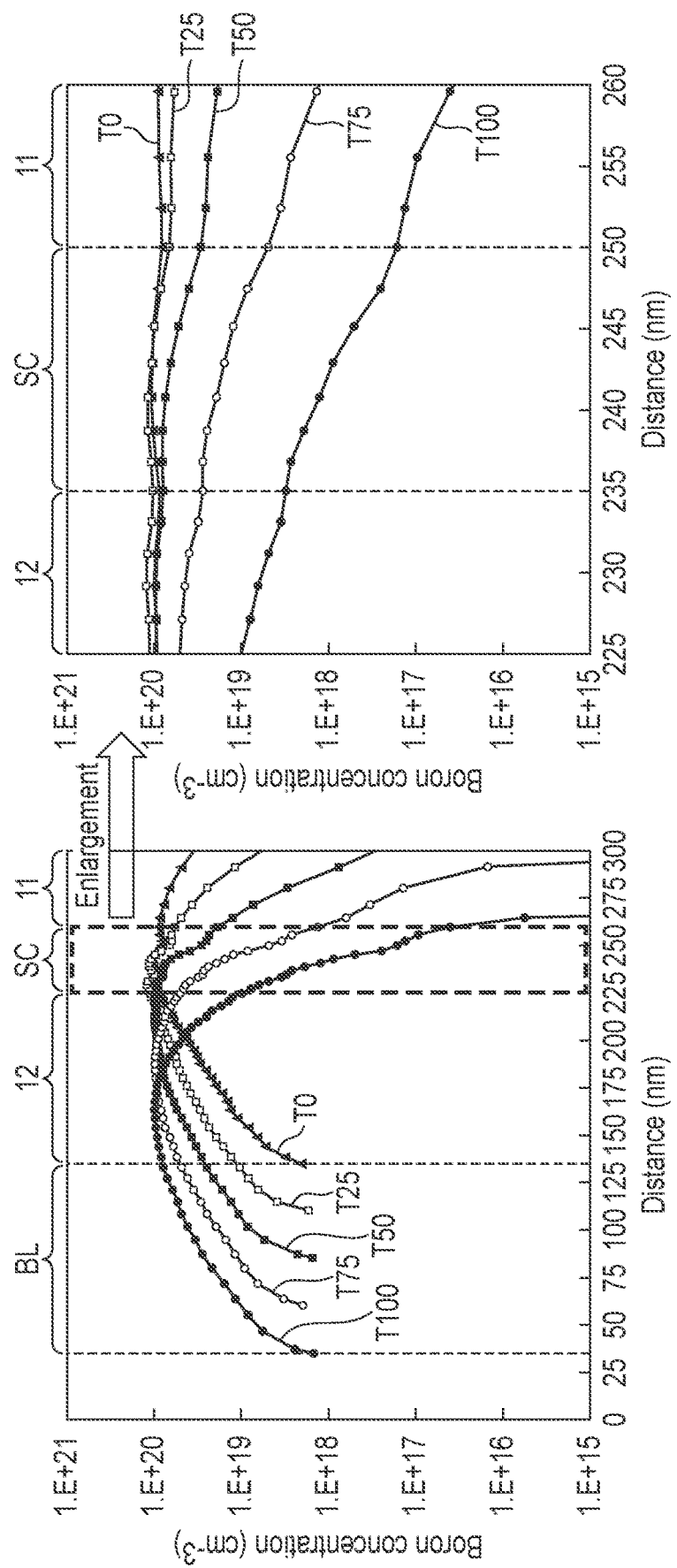
FIG. 9 is a diagram showing simulation results.

FIG. 9 is a diagram showing the simulation results. Here, the acceleration energy during ion implantation was set to 30 keV and the ion dose amount was set to $1\times10^{15}$ ions/cm$^2$.

The horizontal axis of the figure is the distance (nm) along the depth direction. With respect to the position in the depth direction, the left direction of the graph corresponds to the upper direction of the portions P1 and P2, and the right direction of the graph corresponds to the lower direction of the portions P1 and P2. In the upper part of the graph, the range of the buffer layer is indicated as "BL", the range of the second insulating layer as "12", the range of the oxide semiconductor layer as "SC" and the range of the first insulating layer as "11".

The thickness of the second insulating layer 12 is 100 nm, and the thickness of the oxide semiconductor layer SC is 15 nm. The buffer layer BL is a silicon oxide layer.

The vertical axis of the figure indicates the concentration (atoms/cm$^3$) of boron, which is an impurity.

A simulation result T0 obtained when the buffer layer BL has a thickness of 0 nm is equivalent to the simulation result of the portion P1 where the buffer layer BL does not exist. A simulation result T25 obtained when the thickness of the buffer layer BL is 25 nm, a simulation result T50 when the thickness of the buffer layer BL is 50 nm, a simulation result T75 when the thickness of the buffer layer BL is 75 nm, and a simulation result T100 when the thickness of the buffer layer BL is 100 nm, are equivalent to the simulation results of the portion P2 where the buffer layer BL exists.

According to the simulation results shown in FIG. 9, when the thickness of the buffer layer BL is 100 nm, it has been confirmed that the impurity concentration of the portion P2 of the oxide semiconductor layer SC can be reduced by one order of magnitude (one digit) or more, as compared to the impurity concentration of the oxide semiconductor layer SC in the portion P1. The results mean that the oxide semiconductor layer SC in the portion P2 can function as a low-resistance region LD or LS.

Here, a silicon oxide layer is assumed as the buffer layer BL, but when the buffer layer BL is formed of a material having a high density than that of silicon oxide, sufficient ion implantation blocking capability or hydrogen diffusion blocking capability can be exhibited even if the buffer layer BL has a thickness less than that of the above-described simulation.

As explained above, it is possible to provide a manufacturing method that simplifies the manufacturing process of semiconductor devices that suppresses the degradation of reliability.

Based on the method for manufacturing a semiconductor device which has been described in the above-described embodiments, a person having ordinary skill in the art may achieve all kinds of semiconductor device manufacturing method with an arbitral design change; however, as long as they fall within the scope and spirit of the present invention, such semiconductor device manufacturing methods are encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A method of manufacturing a semiconductor device, comprising:
    forming a first insulating layer, an oxide semiconductor layer, a second insulating layer, a buffer layer and a metal layer sequentially on a base;
    forming a patterned resist on the metal layer;
    etching the buffer layer and the metal layer using the resist as a mask to expose an upper surface of the second insulating layer;
    reducing a volume of the resist to expose an upper surface along a side surface of the metal layer;
    etching the metal layer using the resist as a mask, to form a gate electrode including a first side surface and to expose an upper surface along a second side surface of the buffer layer; and
    carrying out ion implantation on the oxide semiconductor layer using the gate electrode as a mask.

2. The manufacturing method of claim 1, wherein the buffer layer is a silicon oxide layer.

3. The manufacturing method of claim 1, wherein the buffer layer is an oxide semiconductor layer.

4. The manufacturing method of claim 1, wherein a width from the first side surface to the second side surface is 0.5 µm or greater.

* * * * *